(12) United States Patent
Shibasaki et al.

(10) Patent No.: US 11,901,474 B2
(45) Date of Patent: Feb. 13, 2024

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Soichiro Shibasaki, Tokyo (JP); Yuya Honishi, Saitama Saitama (JP); Naoyuki Nakagawa, Tokyo (JP); Mutsuki Yamazaki, Yokohama Kanagawa (JP); Yukitami Mizuno, Tokyo (JP); Yasutaka Nishida, Tokyo (JP); Kazushige Yamamoto, Yokohama Kanagawa (JP)

(73) Assignees: KABUSAIRES KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 36 days.

(21) Appl. No.: 17/938,990

(22) Filed: Sep. 7, 2022

(65) Prior Publication Data
US 2023/0006087 A1    Jan. 5, 2023

Related U.S. Application Data

(63) Continuation of application No. PCT/JP2020/038402, filed on Oct. 9, 2020.

(51) Int. Cl.
*H01L 31/072* (2012.01)
*H01L 31/0336* (2006.01)
*H01L 31/05* (2014.01)

(52) U.S. Cl.
CPC ........ *H01L 31/072* (2013.01); *H01L 31/0336* (2013.01); *H01L 31/0504* (2013.01)

(58) Field of Classification Search
CPC ................... H01L 31/072; H01L 31/0336; H01L 31/0504
See application file for complete search history.

(56) References Cited

U.S. PATENT DOCUMENTS

| | | | |
|---|---|---|---|
| 2019/0198697 A1 | 6/2019 | Honishi et al. | |
| 2020/0194608 A1 | 6/2020 | Yamamoto et al. | |

(Continued)

FOREIGN PATENT DOCUMENTS

| | | |
|---|---|---|
| CN | 110112225 | 8/2019 |
| JP | 2014-053572 | 3/2014 |

(Continued)

OTHER PUBLICATIONS

Minami et al., JP2017098479 A, English Machine Translation, pp. 1-17. (Year: 2017).*

(Continued)

*Primary Examiner* — Tae-Sik Kang
(74) *Attorney, Agent, or Firm* — Amin, Turocy & Watson, LLP

(57) ABSTRACT

A solar cell of an embodiment includes a p-electrode, an n-electrode, a p-type light-absorbing layer located between the p-electrode and the n-electrode and mainly containing a cuprous oxide, and a first n-type layer which is located between the p-type light-absorbing layer and the n-electrode, which mainly contains a compound represented by $Ga_{x1}M1_{x2}M2_{x3}M3_{x4}M4_{x5}O_{x6}$, the M1 being Hf and/or Zr, the M2 being one or more selected from the group consisting of In, Ti, and Zn, the M3 being Al and/or B, the M4 is one or more selected from the group consisting of Sn, Si, and Ge, the x1, the x2, and the x6 being more than 0, the x3, the x4, and the x5 being 0 or more, and the x6 when a sum of the (Continued)

x1, the x2, the x3, the x4, and the x5 is 2 being 3.0 or more and 3.8 or less.

15 Claims, 8 Drawing Sheets

(56) References Cited

U.S. PATENT DOCUMENTS

| | | |
|---|---|---|
| 2023/0017543 A1 | 1/2023 | Yamamoto et al. |
| 2023/0125003 A1 | 4/2023 | Nakagawa et al. |

FOREIGN PATENT DOCUMENTS

| | | | |
|---|---|---|---|
| JP | 2017-098479 | | 6/2017 |
| JP | 2017098479 A | * | 6/2017 |
| JP | 2018-046196 | | 3/2018 |
| JP | 2019-57536 | | 4/2019 |
| WO | 2013/161725 | | 10/2013 |
| WO | 2020/059053 | | 3/2020 |
| WO | 2022/074851 | | 4/2022 |
| WO | 2022/074852 | | 4/2022 |

OTHER PUBLICATIONS

Minami et al., "Cu2O-based solar cells using oxide semiconductors", J. Semicond. 2016, 37(1) (Year: 2016).*

Shibasaki et al., "Transparent Cu2O solar cell for high efficiency and low cost tandem photovoltaics", 2019 IEEE 46th Photovoltaic Specialists Conference (PVSC), Jun. 16-21, 2019, ISSN: 0160-8371 (Year: 2019).*

International Search Report for International Application No. PCT/JP2020/038402 dated Dec. 28, 2020, 12 pgs.

Minami, et al., "Heterojunction solar cell with 6% efficiency based on an n-type aluminum-gallium-oxide thin film and p-type sodium-doped Cu2O sheet" Applied Physics Express 8, 022301 (2015).

Minami, et al., "Cu2O-based heterojunction solar cells with an Al-doped ZnO/oxide semiconductor/thermally oxidized Cu2O sheet structure", Solar Energy, 2014, vol. 105, pp. 206-217.

Chua, et al., "Enhancement of the open circuit voltage of Cu2O/Ga2O3 heterojunction solar cells through the mitigation of interfacial recombination" AIP Advances 9, 055203 (2019).

Y. Nishi, et al., "Cu2O-based heterojunction solar cells fabricated using multicomponent oxide semiconductor thin films as an n-type semiconductor layer", The Japan Society of Applied Physics The 60th JSAP Spring Meeting Proceedings, 30a-F2-9, 2013.

* cited by examiner

| | First n-type Layer (First Region) | | Second n-type Layer (Second Region) | | Third n-type Layer (Third Region) | |
|---|---|---|---|---|---|---|
| | Composition | Change | Composition | Change | Composition | Change |
| Example 1 | $Ga_{1.20}Hf_{0.80}O_{3.40}$ | no | - | - | - | - |
| Example 2 | $Ga_{1.20}Hf_{0.75}Ti_{0.05}O_{3.40}$ | no | - | - | - | - |
| Example 3 | $Ga_{1.15}Hf_{0.80}In_{0.05}O_{3.40}$ | no | - | - | - | - |
| Example 4 | $Ga_{1.20}Hf_{0.75}Zn_{0.05}O_{3.35}$ | no | - | - | - | - |
| Example 5 | $Ga_{1.15}Hf_{0.80}Al_{0.05}O_{3.40}$ | no | - | - | - | - |
| Example 6 | $Ga_{1.15}Hf_{0.80}B_{0.05}O_{3.40}$ | no | - | - | - | - |
| Example 7 | $Ga_{1.20}Hf_{0.70}Ti_{0.05}Sn_{0.05}O_{3.40}$ | no | - | - | - | - |
| Example 8 | $Ga_{1.20}Hf_{0.70}Ti_{0.05}Si_{0.05}O_{3.40}$ | no | - | - | - | - |
| Example 9 | $Ga_{1.20}Hf_{0.70}Ti_{0.05}Ge_{0.05}O_{3.40}$ | no | - | - | - | - |
| Example 10 | $Ga_{1.90}Hf_{0.10}O_{3.05}$ | no | - | - | - | - |
| Example 11 | $Ga_{1.40}Hf_{0.60}O_{3.30}$ | no | - | - | - | - |
| Example 12 | $Ga_{1.00}Hf_{1.00}O_{3.50}$ | no | - | - | - | - |
| Example 13 | $Ga_{1.20}Hf_{0.80}O_{3.40}$ | no | $Ga_{1.60}Hf_{0.40}O_{3.20}$ | - | - | - |
| Example 14 | $Ga_{1.20}Hf_{0.80}O_{3.40}$ | no | $Ga_2O_3$ | - | - | - |
| Example 15 | $Ga_{1.20}Hf_{0.80}O_{3.40}$ | no | $Ga_{1.60}Hf_{0.20}Zn_{0.20}O_{3.00}$ | no | $Zn_{1.7}Sn_{0.30}O_{2.30}$ | no |
| Example 16 | $Ga_{1.20}Zr_{0.80}O_{3.40}$ | no | - | - | - | - |
| Example 17 | $Ga_{1.20}Zr_{0.75}Ti_{0.05}O_{3.40}$ | no | - | - | - | - |
| Example 18 | $Ga_{1.15}Zr_{0.80}In_{0.05}O_{3.40}$ | no | - | - | - | - |
| Example 19 | $Ga_{1.20}Zr_{0.75}Zn_{0.05}O_{3.35}$ | no | - | - | - | - |
| Example 20 | $Ga_{1.15}Zr_{0.80}Al_{0.05}O_{3.40}$ | no | - | - | - | - |
| Example 21 | $Ga_{1.15}Zr_{0.80}B_{0.05}O_{3.40}$ | no | - | - | - | - |
| Example 22 | $Ga_{1.20}Zr_{0.70}Ti_{0.05}Sn_{0.05}O_{3.40}$ | no | - | - | - | - |
| Example 23 | $Ga_{1.20}Zr_{0.70}Ti_{0.05}Si_{0.05}O_{3.40}$ | no | - | - | - | - |
| Example 24 | $Ga_{1.20}Zr_{0.70}Ti_{0.05}Ge_{0.05}O_{3.40}$ | no | - | - | - | - |
| Example 25 | $Ga_{1.20}Zr_{0.80}O_{3.40}$ | no | $Ga_{1.6}Zr_{0.40}O_{3.20}$ | - | - | - |
| Example 26 | $Ga_{1.20}Zr_{0.80}O_{3.40}$ | no | $Ga_2O_3$ | - | - | - |
| Example 27 | $Ga_{1.20}Zr_{0.80}O_{3.40}$ | no | $Ga_{1.60}Zr_{0.20}Zn_{0.20}O_{3.00}$ | no | $Ga_{1.7}Sn_{0.30}O_{2.15}$ | no |
| Example 28 | $Ga_{1.90}Zr_{0.10}O_{3.05}$ | no | - | - | - | - |
| Example 29 | $Ga_{1.40}Zr_{0.60}O_{3.30}$ | no | - | - | - | - |
| Example 30 | $Ga_{1.00}Zr_{1.00}O_{3.50}$ | no | - | - | - | - |
| Example 31 | $Ga_{1.20}Hf_{0.40}Zr_{0.40}O_{3.40}$ | no | - | - | - | - |
| Example 32 | $Ga_{1.20}Hf_{0.75}Ti_{0.05}O_{3.40}$ | yes | - | - | - | - |
| Example 33 | $Ga_{1.24}Zr_{0.73}Al_{0.03}O_{3.365}$ | yes | - | - | - | - |
| Example 34 | $Ga_{1.20}Hf_{0.80}O_{3.40}$ | yes | - | - | - | - |
| Example 35 | $Ga_{1.20}Hf_{0.80}O_{3.40}$ | yes | $Ga_{1.80}Hf_{0.20}O_{3.10}$ | yes | - | - |
| Example 36 | $Ga_{1.20}Hf_{0.80}O_{3.40}$ | yes | $Ga_{1.60}Hf_{0.20}Zn_{0.2}O_{3.00}$ | yes | $Zn_{1.5}Ga_{0.2}Sn_{0.30}O_{2.40}$ | yes |
| Example 37 | $Ga_{1.20}Zr_{0.80}O_{3.40}$ | yes | $Ga_{1.80}Zr_{0.20}O_{3.10}$ | yes | - | - |
| Example 38 | $Ga_{1.20}Zr_{0.80}O_{3.40}$ | yes | $Ga_{1.60}Zr_{0.20}Zn_{0.2}O_{3.00}$ | yes | - | - |
| Comparative Example 1 | $Ga_2O_3$ | - | - | - | - | - |
| Comparative Example 2 | $Ga_{1.20}Ti_{0.80}O_{3.40}$ | - | - | - | - | - |
| Comparative Example 3 | $Ga_{1.20}In_{0.80}O_{3.00}$ | - | - | - | - | - |
| Comparative Example 4 | $Ga_{1.20}Zn_{0.80}O_{2.60}$ | - | - | - | - | - |

Fig. 12

|  | Transmittance | Jsc | VoC | FF | Conversion Efficiency |
|---|---|---|---|---|---|
| Example 1 | A | B | A | B | A |
| Example 2 | A | A | A | B | A |
| Example 3 | A | B | A | B | A |
| Example 4 | A | B | A | B | A |
| Example 5 | A | B | A | B | A |
| Example 6 | A | B | A | B | A |
| Example 7 | A | A | A | B | A |
| Example 8 | A | B | A | B | A |
| Example 9 | A | B | A | B | A |
| Example 10 | A | B | B | B | B |
| Example 11 | A | B | B | B | B |
| Example 12 | A | B | A | B | B |
| Example 13 | A | B | A | A | A |
| Example 14 | A | B | A | A | A |
| Example 15 | A | A | A | A | A |
| Example 16 | A | B | A | B | A |
| Example 17 | A | A | A | B | A |
| Example 18 | A | B | B | B | B |
| Example 19 | A | B | A | B | A |
| Example 20 | A | B | A | B | A |
| Example 21 | A | B | A | B | A |
| Example 22 | A | A | B | A | A |
| Example 23 | A | B | A | B | A |
| Example 24 | A | B | A | B | A |
| Example 25 | A | B | A | A | A |
| Example 26 | A | B | A | A | A |
| Example 27 | A | A | A | A | A |
| Example 28 | A | B | B | B | B |
| Example 29 | A | B | B | B | B |
| Example 30 | A | B | A | B | A |
| Example 31 | A | B | A | B | A |
| Example 32 | A | A | B | B | A |
| Example 33 | A | B | A | B | A |
| Example 34 | A | B | A | A | A |
| Example 35 | A | B | A | A | A |
| Example 36 | A | A | A | A | A |
| Example 37 | A | B | A | A | A |
| Example 38 | A | B | A | A | A |
| Comparative Example 1 | A | - | - | - | - |
| Comparative Example 2 | A | A | C | B | C |
| Comparative Example 3 | B | A | C | B | C |
| Comparative Example 4 | A | A | C | B | C |

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Patent Application No. PCT/JP2020/38402, the International Filing Date of which is Oct. 9, 2020, the entire contents of which are incorporated herein by reference.

FIELD

Embodiments described herein relate generally to a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 12 is a table related to Examples.

FIG. 13 is a table related to Examples.

DETAILED DESCRIPTION

A solar cell of an embodiment includes a p-electrode, an n-electrode, a p-type light-absorbing layer located between the p-electrode and the n-electrode and mainly containing a cuprous oxide, and a first n-type layer which is located between the p-type light-absorbing layer and the n-electrode, which mainly contains a compound represented by $Ga_{x1}M1_{x2}M2_{x3}M3_{x4}M4_{x5}O_{x6}$, the M1 being Hf or/and Zr, the M2 being one or more selected from the group consisting of In, Ti, and Zn, the M3 being Al or/and B, the M4 is one or more selected from the group consisting of Sn, Si, and Ge, the x1, the x2, and the x6 being more than 0, the x3, the x4, and the x5 being 0 or more, and the x6 when a sum of the x1, the x2, the x3, the x4, and the x5 is 2 being 3.0 or more and 3.8 or less.

Hereinafter, an embodiment will be described in detail with reference to the drawings. Unless otherwise specified, values at 25° C. and 1 atm (atmosphere) are shown.

First Embodiment

Figure 1:
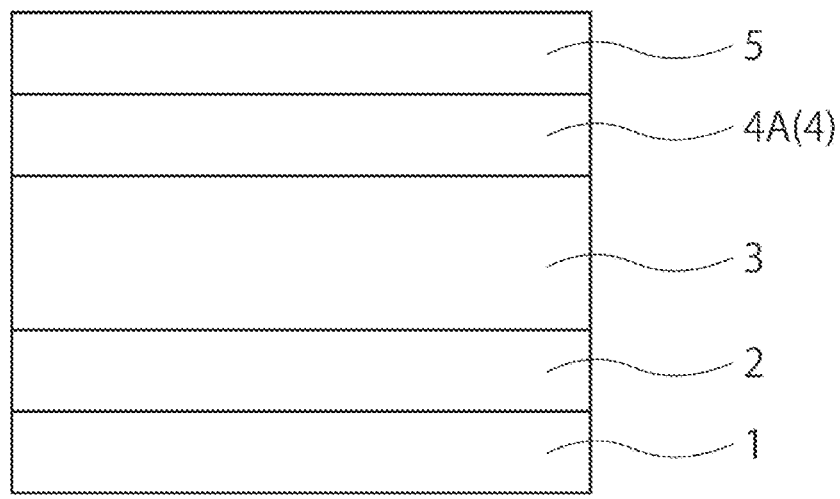
FIG. 1 is a cross-sectional view of a solar cell according to an embodiment.

A first embodiment relates to a solar cell. FIG. 1 illustrates a cross-sectional view of a solar cell 100 of the first embodiment. As illustrated in FIG. 1, the solar cell 100 according to the present embodiment includes a substrate 1, a p-electrode 2 as a first electrode, a p-type light-absorbing layer 3, a first n-type layer 4A, and an n-electrode 5 as a second electrode. An intermediate layer which is not illustrated may be included between the first n-type layer 4A of the n-type layer 4 and the n-electrode 5. Sunlight may be incident from either the n-electrode 5 side or the p-electrode 2 side, but is more preferably incident from the n-electrode 5 side. Since the solar cell 100 of the embodiment is a transmissive solar cell, it is preferable that the solar cell is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the first n-type layer 4A side. Hereinafter, although a configuration illustrated in FIG. 1 will be described, a configuration in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the light-absorbing layer 3. It is preferable that the p-electrode 2 includes one or more layers of transparent conductive oxide films. The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more selected from the group consisting of In, Si, Ge, Ti, Cu, Sb, Nb, Ta, W, Mo, F, Cl, and the like. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 10 nm or less. The metal (including alloy) contained in the metal film is not particularly limited to Mo, Au, Cu, Ag, Al, Ta, W, or the like. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode 2, it is preferable that a film thickness is about 5 nm or less from the viewpoint of transparency. When the line-shaped or mesh-shaped metal film is used, since the transparency is secured at an opening, the film thickness of the metal film is not limited thereto.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is disposed between the p-electrode 2 and the first n-type layer 4A. The p-type light-absorbing layer 3 forms a p-n junction with the first n-type layer 4A. The p-type light-absorbing layer 3 is a semiconductor layer of a metal oxide containing Cu as a main component. The metal oxide containing Cu as the main component is a cuprous oxide or/and a complex oxide of cuprous oxides. 90 wt % or more of the p-type light-absorbing layer 3 is preferably a cuprous oxide or/and the complex oxide of cuprous oxides. 95 wt % or more of the p-type light-absorbing layer 3 is more preferably a cuprous oxide or/and a complex oxide of cuprous oxides. 98 wt % or more of the p-type light-absorbing layer 3 is still more preferably a cuprous oxide or/and a complex oxide of cuprous oxides. It is preferable that the p-type light-absorbing layer 3 hardly contains Cu or/and CuO which is a heterogeneous phase. Since the p-type light-absorbing layer 3 contains less heterogeneous phases and has good crystallinity, it is preferable that the transmittance of the p-type light-absorbing layer 3 is increased. In the metal oxide containing Cu as the main component, Cu is 60.0 atom % or more and 67.0 atom % or less, and oxygen (O) is 32.5 atom % or more and 34.0 atom % or less. The complex oxide of cuprous oxides contains metal other than Cu. The metal contained in the complex oxide of cuprous oxides is one or more metals selected from the group consisting of Sn, Sb, Ag, Li, Na, K, Cs, Rb, Al, Ga, In, Zn, Mg, and Ca in addition to Cu. When one or more metals selected from the group consisting of Ag, Li, Na, K, Cs, Rb, Al, Ga, In, Zn, Mg, and Ca are contained in addition to Cu, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. The p-type light-absorbing layer 3 may further contain Sn or Sb. Sn or Sb in the p-type light-absorbing layer 3 may be added to the light-absorbing layer 3 or may be derived from the p-electrode 2. The p-type light-absorbing layer 3 is a layer of an oxide represented by $Cu_aM_bO_c$. M is one or more metals selected from the group consisting of Sn, Sb, Ag, Li, Na, K, Cs, Rb, Al, Ga, In, Zn, Mg, and Ca. a, b, and c preferably satisfy $1.80 \leq a \leq 2.01$, $0.00 \leq b \leq 0.20$, and $0.98 \leq c \leq 1.02$. A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3. When concentrations of Sn and Sb in the p-type light-absorbing layer 3 are high, defects increase, and carrier recombination increases. Thus, a total volume concentration of Sb and Sn in the p-type light-absorbing layer 3 is preferably $1.5 \times 10^{19}$ atoms/cm$^3$ or less. Compositions of the p-type light-absorbing layer 3 and the first n-type layer 4A are obtained by secondary ion mass spectrometry (SIMS). As an analysis position, an average value of values obtained in the same manner as the p-electrode 2 can be used as each layer composition.

A thickness of the p-type light-absorbing layer 3 is obtained by cross-sectional observation with an electron microscope or a step profiler, and is preferably 1,000 nm or more and 10,000 nm or less.

The p-type light-absorbing layer 3 is preferably formed by, for example, sputtering.

The first n-type layer 4A is an n-type semiconductor layer. The first n-type layer 4A is located between the p-type light-absorbing layer 3 and the n-electrode 5. The first n-type layer 4A is in direct contact with a surface of the p-type light-absorbing layer 3 opposite to a surface in contact with the p-electrode 2. The first n-type layer 4A is an oxide semiconductor layer containing Ga, and preferably contains a compound having Ga as a base. It is preferable that the first n-type layer 4A is an oxide semiconductor layer containing Ga and contains a compound having Ga as a base. In the first n-type layer 4A, an oxide having Ga as a base may be mixed with another oxide, an oxide having Ga as a base may be doped with another element, or an oxide having Ga as a base and doped with another element may be mixed with another oxide.

It is preferable that the first n-type layer 4A is a layer that mainly contains (50 wt % or more of) a compound represented by $Ga_{x1}M1_{x2}M2_{x3}M3_{x4}M4_{x5}O_{x6}$, the M1 is Hf or/and Zr, the M2 is one or more selected from the group consisting of In, Ti, and Zn, the M3 is Al or/and B, and the M4 is one or more selected from the group consisting of Sn, Si, and Ge. The x1, the x2 and the x6 are more than 0.00. The x3, the x4, and the x5 are 0.00 or more. When the sum of the x1, the x2, the x3, the x4, and the x6 is 2, it is preferable that the x6 is 3.0 or more and 3.8 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{x1}M1_{x2}M2_{x3}M3_{x4}M4x5O_{x6}$.

Figure 2:
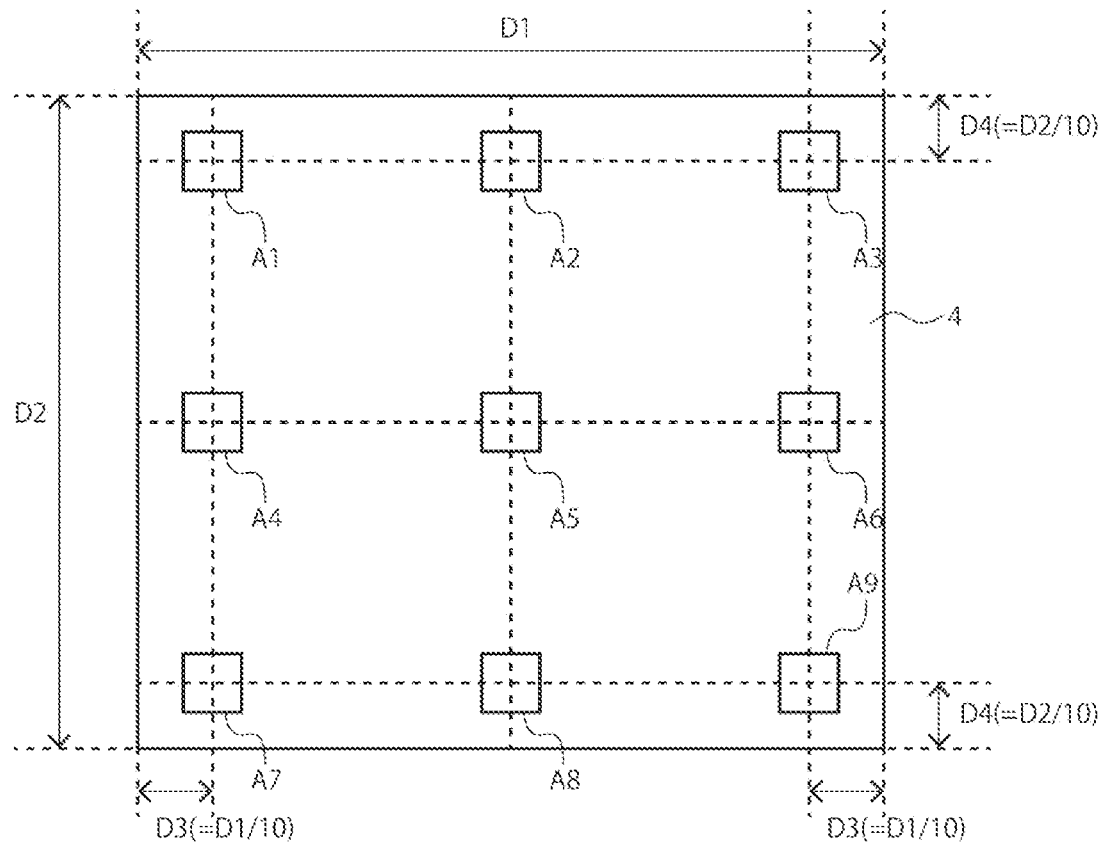
FIG. 2 is a diagram illustrating analysis spots of a solar cell according to an embodiment.

90 wt % or more of the first n-type layer 4A is preferably a compound represented by $Ga_{x1}M1_{x2}M2_{x3}M3_{x4}M4_{x5}O_{x6}$. 95 wt % or more of the first n-type layer 4A is more preferably a compound represented by $Ga_{x1}M1_{x2}M2_{x3}M3_{x4}M4x5O_{x6}$. 98 wt % or more of the first n-type layer 4A is still more preferably a compound represented by $Ga_{x1}M1_{x2}M2_{x3}M3_{x4}M4x5O_{x6}$. The first n-type layer 4A more preferably consists of a compound represented by $Ga_{x1}M1_{x2}M2_{x3}M3_{x4}M4x5O_{x6}$. A remaining component of the composition may include, for example, MgO. For example, regarding the ratio of Zn and Mg when Zn is contained in the constituent elements, it is preferable that the connection of the conduction band is improved A composition of the compound of the first n-type layer 4A is an average composition of the entire first n-type layer 4A unless otherwise specified. When a thickness of the first n-type layer 4A is d, the composition of the first n-type layer 4A is an average value of the compositions at depths of 0.2d, 0.5d, and 0.8d from a surface of the first n-type layer 4A on the p-type light-absorbing layer 3 side. Unless there is a condition that an elemental composition ratio of the compound of the first n-type layer 4A is inclined, the first n-type layer 4A preferably satisfies the above compositions and the following suitable compositions at each depth. When the first n-type layer 4A is very thin (for example, 5 nm or less), the composition at a depth of 0.5d from the surface of the first n-type layer 4A on the p-type light-absorbing layer 3 side can be regarded as the composition of the entire first n-type layer 4A. In the analysis, analysis spots distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the first n-type layer 4A in a width direction, and D2 is a length of the first n-type layer 4A in a depth direction.

A film thickness of the first n-type layer 4A is typically 3 nm or more and 100 nm or less. When the film thickness of the first n-type layer 4A is less than 3 nm, a leakage current may be generated in a case where coverage of the first n-type layer 4A is poor, and characteristics may be deteriorated. When the coverage is good, the film thickness is not limited to the above film thickness. When the film thickness of the first n-type layer 4A exceeds 50 nm, characteristics may be deteriorated due to an excessive increase in resistance of the first n-type layer 4A, or a short-circuit current may be reduced due to a decrease in transmittance. Accordingly, the film thickness of the first n-type layer 4A is more preferably 3 nm or more and 30 nm or less, still more preferably 5 nm or more and 30 nm or less.

The first n-type layer 4A which reduces the difference between the conduction band minimum (CBM) of the p-type light-absorbing layer 3 and the conduction band minimum of the first n-type layer 4A is preferable. The element of M1 is contained in the compound of the first n-type layer 4A in order to reduce the difference in the conduction band minimum because the conduction band minimum of $Ga_2O_3$ is very low compared with the p-type light-absorbing layer 3. The difference between the conduction band minimum of the p-type light-absorbing layer 3 and the conduction band minimum of the first n-type layer 4A ([conduction band minimum of p-type light-absorbing layer 3]–[conduction band minimum of first n-type layer 4A]) is preferably 0.0 eV or more and 0.4 eV or less.

A refractive index of the first n-type layer 4A, which is mixed with an oxide of M1 and $Ga_2O_3$, does not decrease (do not decrease substantially) than a $Ga_2O_3$ layer. Therefore, it is preferable that the first n-type layer 4B contains a compound represented by $Ga_{x1}M1_{x2}M2_{x3}M3_{x4}M4x5O_{x6}$ containing the element of M1. A refractive index of $Cu_2O$ is large, and a refractive index of n-electrode 5 is smaller than that of $Cu_2O$. Therefore, it is preferable that a refractive index of the first n-type layer 4A is 1.0 times or less of the refractive index of the p-type light-absorbing layer 3 and 1.0 times or more of the refractive index of the n-electrode 5 in order to increase amount of light incident on the p-type light-absorbing layer 3 and to increase a light transmittance between the p-type light-absorbing layer 3 and the n-electrode 5. Since a refractive index of an oxide containing a large amount of Ga in addition to Hf or/and Zn is not smaller than a refractive index of $Ga_2O_3$ thereof, it is easy to adjust the refractive index to the above preferable refractive index. Thus, considering the conduction band minimum and the refractive index, Hf and/or Zr as the element of M1 is preferably used. Since the refractive index of the first n-type layer 4A can be larger by adding Hf or Zr which is heavier than Ga and can be adjusted difference in a refractive index with the p-type light-absorbing layer 3 and n-electrode 5, reflection at each interface caused by the difference in the refractive index, and reduction of the short-circuit current may be suppressed.

The conduction band minimum of the first n-type layer 4A of the embodiment is adjusted mainly by the elements of Ga and M1. An element ratio of M1 is increased, and thus, the conduction band minimum of the first n-type layer 4A increases, and the difference in the conduction band minimum of the p-type light-absorbing layer 3 can be reduced. In the first n-type layer 4A, (x1+x2)/(x1+x2+x3+x4+x5) is preferably 0.60 or more and 1.00 or less. According to the same viewpoint, in the first n-type layer 4A, (x1+x2)/(x1+x2+x3+x4+x5) is preferably 0.80 or more and 1.00 or less, and more preferably 0.90 or more and 1.00 or less. x2/(x1+x2) is preferably 0.10 or more and 0.60 or less. When x2/(x1+x2) is less than 0.10, it is difficult to obtain a solar cell having high conversion efficiency because a big cliff in which a conduction band at a p-n junction interface becomes discontinuous occurs and Voc is low. When x2/(x1+x2) is more than 0.60, it is difficult to obtain a solar cell having high conversion efficiency because a spike in which a conduction band at a p-n junction interface becomes discontinuous occurs, and FF decreases. Since Hf and Zr does not lowers the refractive index of a Ga-based n-type layer as mentioned above, the compound represented by $Ga_{x1}M1_{x2}M2_{x3}M3_{x4}M4_{x5}O_{x6}$ containing appropriate amount of M1 contributes improving the efficiency of the solar cell by increasing Jsc. According to the above viewpoint, X2/(x1+x2) is preferably 0.20 or more and 0.55 or less.

The compound of the first n-type layer 4A can contain one or more selected from the group consisting of In, Ti, and Zn, represented by M2. The element of M2 can increase the refractive index of the first n-type layer 4A. The element of M2 can adjust the conduction band minimum of the first n-type layer 4A. If the element of M2 is too much, the difference in the conduction band minimum between the first n-type layer 4A and the p-type light-absorbing layer 3 may be large, x3/(x1+x2+x3+x4+x5) is preferably 0.00 or more and 0.40 or less. x3/(x1+x2+x3+x4+x5) is more preferably 0.00 or more and 0.10 or less, and more preferably 0.00 or more and 0.05 or less.

The compound of the first n-type layer 4A can contain one or more selected from the group consisting of Al or/and B represented by M3. The element of M3 can decrease the refractive index of the first n-type layer 4A unlike M2. x4/(x1+x2+x3+x4+x5) is preferably 0.00 or more and 0.20 or less, and more preferably 0.00 or more and 0.10 or less. When the element of M3 is contained, the conduction band minimum of the first n-type layer 4A is changed, and therefore, the ratio of the element of M3 can be selected in order to adjust the conduction band minimum of the first n-type layer 4A.

The compound of the first n-type layer 4A can contain one or more selected from the group consisting of Sn, Si, and Ge represented by M4. When the element of M4 is contained in the first n-type layer 4A, a carrier concentration of the first n-type layer 4A can be increased. $x5/(x1+x2+x3+x4+x5)$ is 0.00 or more and 0.20 or less, more preferably 0.00 or more and 0.10 or less, and more preferably 0.00 or more and 0.05 or less.

One or more selected from the group consisting of the elements of Ga, the element of M1, the element of M2, the element of M3, and the element of M4 may have a composition ratio changing in the first n-type layer 4A in a film thickness direction of the first n-type layer 4A. It is preferable that the element of M2 and the element of M4 are small on the p-type light-absorbing layer 3 side and is large on the n-electrode 5 side. It is preferable that the element of M3 is large on the p-type light-absorbing layer 3 side and is small on the n-electrode 5 side. It is preferable that the composition of M1 is changed according to the change in the composition ratio of other elements. It is preferable that the change in the composition is an inclined change, a stepwise change, or a combination of the inclined change and the stepwise change. The change in the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

The first n-type layer 4A is preferably formed by, for example, sputtering, atomic layer deposition (ALD), or the like.

The n-electrode 5 is an electrode on the first n-type layer 4A side having transparency to visible light. The first n-type layer 4A is sandwiched between the n-electrode 5 and the p-type light-absorbing layer 3. An intermediate layer which is not illustrated can be provided between the first n-type layer 4A and the n-electrode 5. The intermediate layer can include a mesh-shaped or line-shaped electrode. It is preferable that even when the intermediate layer is provided, the first n-type layer 4A and the n-electrode 5 are in direct contact with each other. It is preferable that a transparent conductive oxide film is used for the n-electrode 5. It is preferable that the transparent conductive oxide film used for the n-electrode 5 is one or more kinds of transparent conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. Graphene may be used for the n-electrode 5. It is preferable that graphene is stacked with Ag nano wires.

A thickness of the n-electrode 5 is obtained by cross-sectional observation with an electron microscope or a step gauge, and is not particularly limited, but is typically 1 nm or more and 2 µm or less.

It is preferable that the n-electrode 5 is formed by, for example, sputtering.

Second Embodiment

Figure 3:
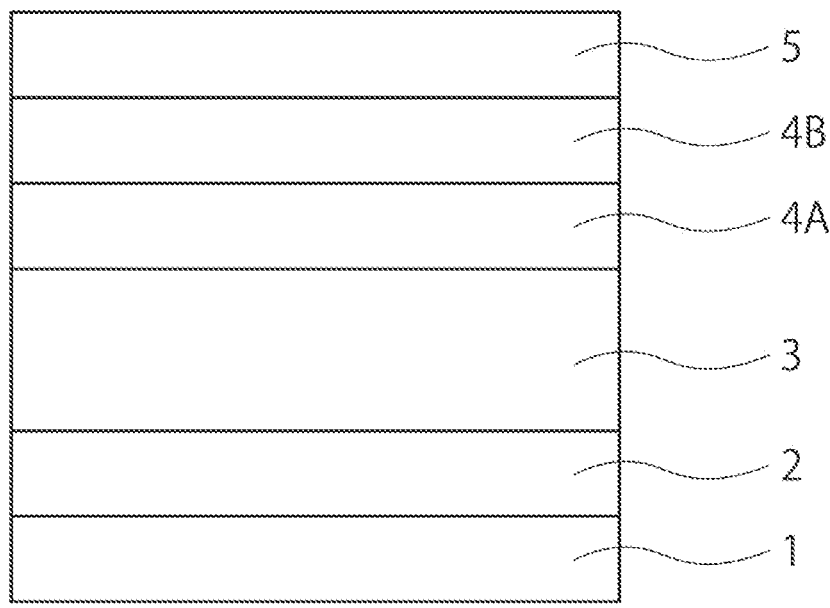
FIG. 3 is a cross-sectional view of a solar cell according to an embodiment.

A second embodiment relates to a solar cell. FIG. 3 is a schematic cross-sectional view of a solar cell 101 according to the second embodiment. The solar cell 101 of the second embodiment is different from the solar cell 100 of the first embodiment in that the n-type layer 4 has the first n-type layer 4A and a second n-type layer 4B. Description common to the first embodiment and the second embodiment will be omitted.

The second n-type layer 4B is located between the first n-type layer 4A and the n-electrode 5. A surface of the second n-type layer 4B on the first n-type layer 4A side is in direct contact with the first n-type layer 4A. The second n-type layer 4B is an oxide semiconductor layer containing Ga, and preferably contains a compound having Ga as a base. An interface between the first n-type layer 4A and the second n-type layer 4B may be clear or unclear. In the second n-type layer 4B an oxide having Ga as a base may be mixed with another oxide, an oxide having Ga as a base may be doped with another element, or an oxide having Ga as a base and doped with another element may be mixed with another oxide. An intermediate layer which is not illustrated can be provided between the second n-type layer 4B and the n-electrode 5. In view of reducing reflection, it is preferable that a refractive index of the second n-type layer 4B is smaller than the refractive index of the first n-type layer 4A.

It is preferable that the second n-type layer 4B is a layer that mainly contains (50 wt % or more of) a compound represented by $Ga_{y1}M1_{y2}M2_{y3}M3_{y4}M4_{y5}O_{y6}$ the M1 is Hf or/and Zr, the M2 is one or more selected from the group consisting of In, Ti, and Zn, the M3 is Al or/and B, and the M4 is one or more selected from the group consisting of Sn, Si, and Ge. The y1 and the y6 are more than 0.00. The y2, the y3, the y4, and the y5 are 0.00 or more. When a sum of the y1, the y2, the y3, the y4, and the y5 is 2, it is preferable that the y6 is 3.0 or more and 3.8 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{y1}M1_{y2}M2_{y3}M3_{y4}M4y5O_{y6}$.

90 wt % or more of the second n-type layer 4B is preferably a compound represented by $Ga_{y1}M1_{y2}M2_{y3}M3_{y4}M4_{y5}O_{y6}$. 95 wt % or more of the second n-type layer 4B is more preferably a compound represented by $Ga_{y1}M1_{y2}M2_{y3}M3_{y4}M4_{y5}O_{y6}$. 98 wt % or more of the second n-type layer 4B is still more preferably a compound represented by $Ga_{y1}M1_{y2}M2_{y3}M3_{y4}M4_{y5}O_{y6}$. The second n-type layer 4B more preferably consists of a compound represented by $Ga_{y1}M1_{y2}M2_{y3}M3_{y4}M4y5O_{y6}$.

The conduction band minimum of the second n-type layer 4B is adjusted by mainly by Ga and M1. The conduction band minimum of the second n-type layer 4B is decreased than the conduction band minimum of the first n-type layer 4A by reducing the element ratio of M1. As the result, the continuity of the connection of the conduction band minimum from the first n-type layer 4A to n-electrode 5 is improved. In the second n-type layer, $(y1+y2)/(y1+y2+y3+y4+y5)$ is preferably 0.60 or more and 1.00 or less. According to the same viewpoint, $(y1+y2)/(y1+y2+y3+y4+y5)$ is preferably 0.80 or more and 1.00 or less, more preferably 0.90 or more and 1.00 or less in the second n-type layer 4B.

The second n-type layer 4B is a layer having the conduction band minimum which is lower than the conduction band minimum of the first n-type layer 4A, and the conduction band minimum of the second n-type layer 4B is between the conduction band minimum of the first n-type layer 4A and the conduction band minimum of the n-electrode 5. By using the second n-type layer 4B, the conduction band minimum from the first n-type layer 4A to n-electrode 5 is continuously connected, FF and Voc are improved, and it contributes improving the conversion efficiency. When y2 is more than 0, the second n-type layer 4B contains the element M1 which is contained in the first n-type layer 4A. Therefore, when Hf is contained in the first n-type layer, it is preferable that Hf is contained in the second n-type layer 4B rather than Hf is not contained. Additionally, the conduction band minimum of the second n-type layer 4B is smaller than the conduction band minimum of the first n-type layer 4A and the continuity of the connection of the conduction band minimum is improved because the y1 is more than the x1 and the y2 is less than the x2. According to the same viewpoint, y2/(y1+y2) is preferably 0.00 or more and 0.30 or less, more preferably 0.00 or more and 0.20 or less. When the x2 is close to the y2, improving the continuity of the connection of the conduction band minimum is little by using the second n-type layer 4B. Therefore, the y2 is preferably 90% or less of the the x2, more preferably 80% or less of the x2, more preferably 70% or less of the the x2.

The the y3, the y4, and the y5 are preferably the x3, the x4, and the x5 of the first embodiment. Therefore, y3/(y1+y2+y3+y4+y5) is preferably 0.00 or more and 0.40 or less, more preferably 0.00 or more and 0.10 or less, more preferably 0.00 or more 0.05 or less. y4/(y1+y2+y3+y4+y5) is preferably 0.00 or more and 0.20 or less, more preferably 0.00 or more and 0.10 or less, more preferably 0.00 or more 0.05 or less. y5/(y1+y2+y3+y4+y5) is preferably 0.00 or more and 0.20 or less, more preferably 0.00 or more and 0.10 or less, more preferably 0.00 or more 0.05 or less.

The sum of a film thickness of the first n-type layer 4A and a film thickness of the second n-type layer 4B is typically 3 nm or more and 100 nm or less. When the sum of the film thickness of the first n-type layer 4A and the film thickness of the second n-type layer 4B is less than 3 nm, a leakage current may be generated in a case where coverage of the first n-type layer 4A and the second n-type layer 4B is poor, and characteristics may be deteriorated. When the coverage is good, the film thickness is not limited to the above film thickness. When the sum of the film thickness of the first n-type layer 4A and the film thickness of the second n-type layer 4B exceeds 50 nm, characteristics may be deteriorated due to an excessive increase in resistance of the n-type layer containing the first n-type layer 4A and the second n-type layer 4B, or a short-circuit current may be reduced due to a decrease in transmittance. Accordingly, the sum of the film thickness of the first n-type layer 4A and the film thickness of the second n-type layer 4B is more preferably 3 nm or more and 30 nm or less, still more preferably 5 nm or more and 30 nm or less.

One or more selected from the group consisting of the elements of Ga, the element of M1, the element of M2, the element of M3, and the element of M4 may have a composition ratio changing in the second n-type layer 4B in a film thickness direction of the second n-type layer 4B. In the second n-type layer 4B, It is preferable that the element of M2 and the element of M4 is small on the p-type light-absorbing layer side and large on the n-electrode side 5. It is preferable that the element of M3 is large on the p-type light-absorbing layer 3 side and is small on the n-electrode 5 side. It is preferable that the change in the composition is an inclined change, a stepwise change, or a combination of the inclined change and the stepwise change. The change in the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

Third Embodiment

Figure 4:
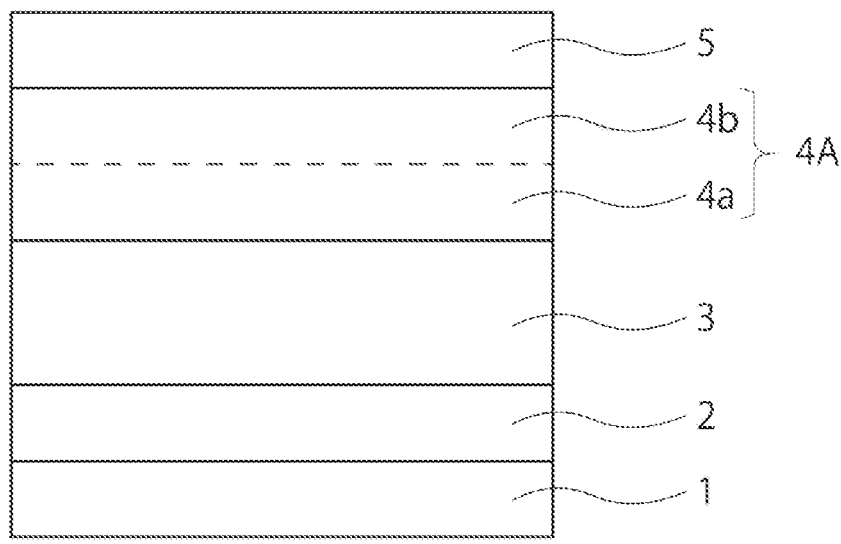
FIG. 4 is a cross-sectional view of a solar cell according to an embodiment.

A third embodiment relates to a solar cell. FIG. 4 is a schematic cross-sectional view of a solar cell 102 according to the third embodiment. The solar cell 101 of the third embodiment is different from the solar cell 100 of the first embodiment in that the first n-type layer 4A has a first region 4a and a second region 4b, and so forth. Description common to the third embodiment and the first to second embodiments will be omitted.

The first region 4a is located on the p-type light-absorbing layer 3 side of the first n-type layer 4A. The second region 4b is located on the n-electrode 5 side of the first n-type layer 4A. Although the composition of the p-type light-absorbing layer 3 side and the n-electrode 5 of the first n-type layer 4A of the third embodiment is clearly different, an interface between the first region 4a and the second region 4b is not confirmed. A region from a surface of the first n-type layer 4A on the p-type light-absorbing layer 3 side toward the n-electrode 5 side up to half a thickness of the first n-type layer 4A is defined as the first region 4a. A region from a surface of the first n-type layer 4A on the n-electrode 5 side toward the p-type light-absorbing layer 3 side up to half a thickness of the first n-type layer 4A is defined as the second region 4b. As in the first embodiment, in the analysis, analysis spots distributed as evenly as possible at equal intervals as represented in analysis spots of FIG. 2 at each distance from the surface of the n-type layer are analyzed by, for example, SIMS.

A composition of the compound of the first n-type region 4a is an average composition of the entire first n-type region 4a unless otherwise specified. When a thickness of the first n-type layer 4A is d, the composition of the first n-type region 4a is an average value of the compositions at depths of 0.10d, 0.25d, and 0.40d from a surface of the first n-type layer 4A on the p-type light-absorbing layer 3 side. When the first n-type layer 4A is very thin (for example, 10 nm or less), the composition at a depth of 0.25d from the surface of the first n-type layer 4A on the p-type light-absorbing layer 3 side is regarded as the composition of the entire first n-type region 4a. When a thickness of the first n-type layer 4A is d, the composition of the second n-type region 4b is an average value of the compositions at depths of 0.60d, 0.75d, and 0.80d from a surface of the first n-type layer 4A on the p-type light-absorbing layer 3 side. When the first n-type layer 4A is very thin (for example, 10 nm or less), the composition at a depth of 0.75d from the surface of the first n-type layer 4A on the p-type light-absorbing layer 3 side is regarded as the composition of the entire second n-type region 4b.

(x1+x2)/(x1+x2+x3+x4+x5) is preferably 0.80 or more 1.00 or less, more preferably 0.90 or more and 1.00 or less in the first region 4A. (x1+x2)/(x1+x2+x3+x4+x5) is 0.60 or more and 1.00 or less, preferably 0.80 or more and 1.00 or less, more preferably 0.90 or more and 1.00 or less.

It is preferable that the x2 which is the compositional ratio of the element of M1 changes like inclinedly, step-wisely, or as a combination of inclinedly and step-wisely. When the composition ratio of M1 is changed in a film thickness direction, a composition ratio of Ga is changed in the film direction corresponding to the change of M1. The change of the composition is entirely or partially in a stacking direction of the p-type light-absorbing layer 3 and the first n-type layer 4A of the solar cell 100. When an element ratio of M1 is high on the first region 4a side and low on the second region 4b side, the continuity of the connection of the conduction band minimum is preferably improved. The x2 in the second region 4b is preferably lower than the x2 in the first region 4a and is more preferably more than 20% lower than x2 in the first region 4a. Thus, in view of the continuity of the connection of the conduction band minimum, x2/(x1+x2) in the first region 4a is preferably 0.20 or more and 0.55 or less, and x2/(x1+x2) in the second region 4b is preferable 0.00 or more and 0.30 or less.

When the element of M2 is contained, it is preferable that the element ratio of M2 changes like inclinedly, step-wisely, or as a combination of inclinedly and step-wisely. The change of the composition is entirely or partially in a stacking direction of the p-type light-absorbing layer 3 and the first n-type layer 4A of the solar cell 100. A pattern of the compositional change of M2 is appropriately selected in view of the location of the regions and a conduction band minimum and a refractive index of a connected layer. In view of, for example, the continuity of the connection of the conduction band minimum, the x3 in the first region 4a is preferably lower than the x3 in the second region 4b and is more preferably more than 20% lower than x3 in the second region 4b. In view of the refractive index, the x3 in the first region 4a is preferably lower than the x3 in the second region 4b, and more preferably more than 20% lower than x3 in the second region 4b.

When the element of M3 is contained, it is preferable that the element of M3 changes like inclinedly, step-wisely, or as a combination of inclinedly and step-wisely. The change of the composition is entirely or partially in a stacking direction of the p-type light-absorbing layer 3 and the first n-type layer 4A of the solar cell 100. In view of the continuity of the connection of the conduction band minimum, the x4 in the second region 4b is preferably lower than the x4 in the first region 4a, and more preferably more than 20% lower than x4 in the first region 4a.

When the element of M4 is contained, it is preferable that the element of M4 changes inclinedly, step-wisely, or as like a combination of inclinedly and step-wisely. The change of the composition is entirely or partially in a stacking direction of the p-type light-absorbing layer 3 and the first n-type layer 4A of the solar cell 100. In view of the carrier concentration, the x5 in the first region 4a is preferably lower than the x5 in the second region 4b and is more preferably more than 20% lower than x5 in the second region 4b.

A relationship between the element ratio of the first region 4a and the second region 4b of the third embodiment and a relationship between the first n-type layer 4A and the second n-type layer 4B of the second embodiment corresponds to the composition ratio of elements. Accordingly, an inclined compositional change and the like described in the third embodiment are the same in the solar cell 101 and the like of the second embodiment.

Fourth Embodiment

Figure 5:
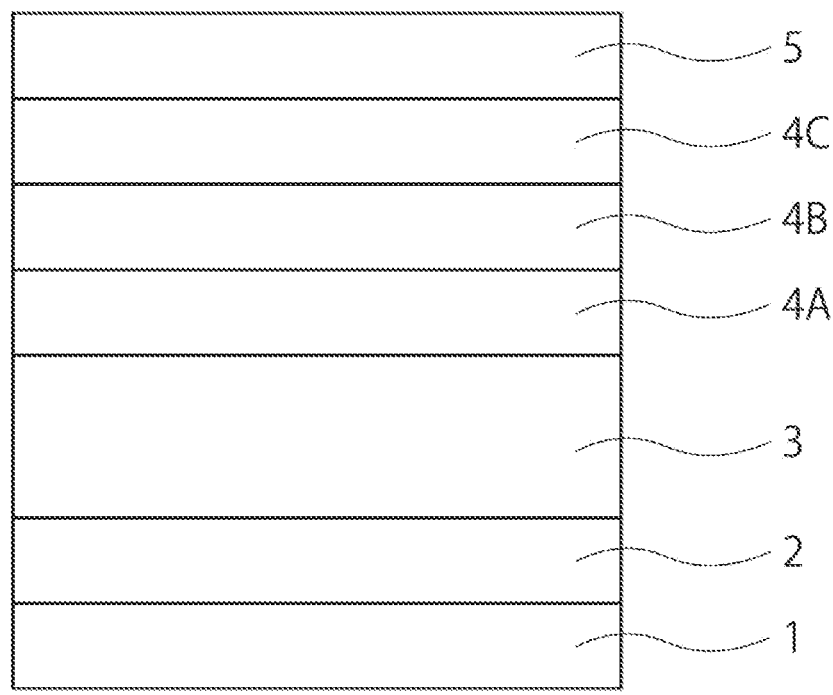
FIG. 5 is a cross-sectional view of a solar cell according to an embodiment.

A fourth embodiment relates to a solar cell. FIG. 5 is a schematic cross-sectional view of a solar cell 103 according to the fourth embodiment. The solar cell 103 of the fourth embodiment differs from the solar cell 101 of the second embodiment in that the solar cell 103 has an n-type layer 4 in which the first n-type layer 4A, the second n-type layer 4B, and a third n-type layer 4C are stacked. Description common to the first embodiment to the third embodiment and the fourth embodiment will be omitted.

The third n-type layer 4C is located between the second n-type layer 4B and the n-electrode 5. A surface of the third n-type layer 4C on the second n-type layer 4B side is in direct contact with the second n-type layer 4B. It is preferable that the third n-type layer 4C is an oxide semiconductor layer containing Ga or/and Zn and contains a compound having Ga or/and Zn as a base. An interface between the second n-type layer 4B and the third n-type layer 4C may be clear or unclear. In the third n-type layer 4C, an oxide having Ga or/and Zn as a base may be mixed with another oxide, an oxide having Ga or/and Zn as a base may be doped with another element, or an oxide having Ga or/and Zn as a base and doped with another element may be mixed with another oxide. An intermediate layer which is not illustrated can be provided between the third n-type layer 4C and the n-electrode 5.

It is preferable that the third n-type layer 4C is a layer that mainly contains (50 wt % or more of) a compound represented by $Ga_{z1}Zn_{z2}Sn_{z3}M5_{z4}O_{z5}$, and the M5 is one or more selected from the group consisting of Hf, Zr, In, Ti, Al, B, Si, Mg, and Ge. The z1, the z2, the z3, the z4 and the z5 is 0.00 or more. When the sum of the z1, the z2, the z3, and the z4 is 2, it is preferable that the z5 is 2.2 or more and 3.6 or less. the z3 and the z5 are preferably more than 0. All of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{z1}Zn_{z2}Sn_{z3}M5_{z4}O_{z5}$.

90 wt % or more of the third n-type layer 4C is preferably a compound represented by $Ga_{z1}Zn_{z2}Sn_{z3}M5_{z4}O_{z5}$. 95 wt % or more of the third n-type layer 4C is more preferably a compound represented by $Ga_{z1}Zn_{z2}Sn_{z3}M5_{z4}O_{z5}$. 98 wt % or more of the third n-type layer 4C is still more preferably a compound represented by $Ga_{z1}Zn_{z2}Sn_{z3}M5_{z4}O_{z5}$. The third n-type layer 4C more preferably consists of a compound represented by $Ga_{z1}Zn_{z2}Sn_{z3}M5_{z4}O_{z5}$.

The third n-type layer 4C is adjusted by mainly Ga, Zn and Sn so as to decrease a difference in the conduction band minimum from the second n-type layer 4B and a difference in the conduction band minimum from the n-electrode 5. The third n-type layer 4C can have a smaller difference in the conduction band minimum from the n-electrode 5 than $Ga_2O_3$ because the conduction band minimum of ZnO and $SnO_2$ is smaller than the conduction band minimum of $Ga_2O_3$. The conduction band minimum of the third n-type layer 4C becomes smaller than that of the first n-type layer 4A so that the element ratio of Zn and Sn makes larger than the element ratio of Zn and Sn of the first n-type layer 4A and the second n-type layer 4C. As the result, the continuity of the connection of the conduction band minimum from the first n-type layer 4A to n-electrode 5 is improved. (z1+z2)/(z1+z2+z3+z4) is preferably 0.60 or more and 0.98 or less in the third n-type layer 4C. According to the same viewpoint, (z1+z2)/(z1+z2+z3+z4) is preferably 0.65 or more and 0.95 or less, and more preferably 0.70 or more and 0.90 or less in the third n-type layer 4C.

The third n-type layer 4C is located closest to the n-electrode 5 side in the n-type layer 4, and preferably, the third n-type layer 4C is in direct contact with the n-electrode 5. When Zn or Sn is contained in the first n-type layer 4A and the second n-type layer 4B, the composition ratio thereof is preferably lower than each concentration of Zn and Sn in the third n-type layer 4C.

The third n-type layer 4C preferably contains Sn. When Sn is contained in the third n-type layer 4C, the continuity of the connection of the conduction band minimum is preferably improved, and a carrier concentration is preferably increased. Thus, $z3/(z1+z2+z3+z4)$ is preferably 0.10 or more and 0.50 or less, and more preferably 0.15 or more and 0.30 or less.

The element of M5 may or may not be contained in the third n-type layer 4C. When the element of M5 is contained, the composition ratio thereof is preferably low. Thus, $z4/(z1+z2+z3+z4)$ is preferably 0.00 or more and 0.05 or less. The element of M5 is preferably common to the elements contained in the second n-type layer 4B.

In the third n-type layer 4C, Ga, Zn, Sn, and the element of M5 may change inclinedly, step-wisely, or as like a combination of inclinedly and step-wisely from the p-type light-absorbing layer 3 side toward the n-electrode 5. For example, the amount of Sn is preferably large on the n-electrode 5 side, and the amount of Ga and Zn is preferably large on the second n-type layer 4B side.

The sum of a film thickness of the first n-type layer 4A, a film thickness of the second n-type layer 4B, and a film thickness of the third n-type layer 4C is typically 3 nm or more and 100 nm or less. When the sum of the film thickness of the first n-type layer 4A, the film thickness of the second n-type layer 4B, and the film thickness of the third n-type layer 4C is less than 3 nm, a leakage current may generated in a case where coverage of a film thickness of the first n-type layer 4A, a film thickness of the second n-type layer 4B, and a film thickness of the third n-type layer 4C is poor, and characteristics may be deteriorated. When the coverage is good, the film thickness is not limited to the above film thickness. When the sum of the film thickness of the first n-type layer 4A, the film thickness of the second n-type layer 4B, and the film thickness of the third n-type layer 4C exceeds 50 nm, characteristics may be deteriorated due to an excessive increase in resistance of the n-type layer 4 from the first n-type layer 4A to the third n-type layer 4C, or a short-circuit current may be reduced due to a decrease in transmittance. Accordingly, the sum of the film thickness of the first n-type layer 4A, the film thickness of the second n-type layer 4B, and the film thickness of the third n-type layer 4C is more preferably 3 nm or more and 30 nm or less, still more preferably 5 nm or more and 30 nm or less.

One or more selected from the group consisting of Ga, Zn, Sn, and the element of M5 may have a composition ratio changing in the third n-type layer 4C in a film thickness direction of the third n-type layer 4C.

A solar cell having a n-type layer in which the second n-type layer 4B is not included, that is, the n-type layer which consists of the first n-type layer 4A and the third n-type layer 4C and so forth are included in the modification of the fourth embodiment.

Fifth Embodiment

Figure 6:
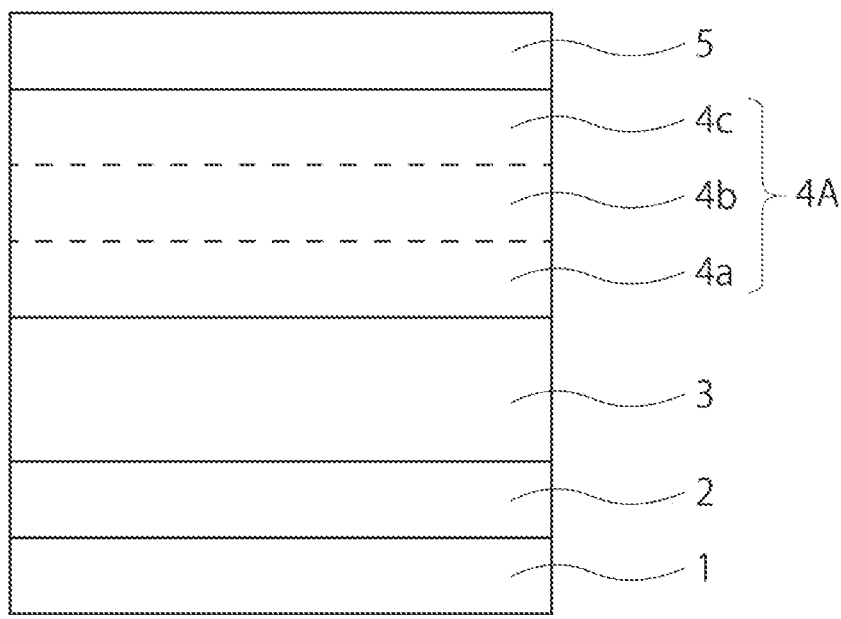
FIG. 6 is a cross-sectional view of a solar cell according to an embodiment.

A fifth embodiment relates to a solar cell. FIG. 6 is a schematic cross-sectional view of a solar cell 104 according to the fifth embodiment. The solar cell 104 of the fifth embodiment is different from the solar cell 102 of the third embodiment in that the first n-type layer 4A has a first region 4a a second region 4b, and a third region 4c. Description common to the first embodiment to the fourth embodiment, and the fourth embodiment will be omitted. The third region 4c of the fifth embodiment corresponds to the third n-type layer 4C of the fourth embodiment.

The third region 4c is located on the n-electrode 5 side of the first n-type layer 4A. The second region 4b is located between the third region 4c and the first region 4a. Although the composition is significantly different on the p-type light-absorbing layer 3 side and the n-electrode 5 side in the first n-type layer 4A in the fifth embodiment, an interface between the first region 4a and the second region 4b and an interface between the second region 4b and the third region 4c are not confirmed. When a thickness of the first n-type layer 4A is d, the first region 4a is from a surface of the first n-type layer 4A on the p-type light-absorbing layer 3 side toward the n-electrode 5 to a depth of 0.33d. The third region 4c is from a surface of the first n-type layer 4A on the n-electrode 5 side toward the p-type light-absorbing layer 3 to a depth of 0.33d toward the p-type light-absorbing layer 3. The second region 4b is located between the first region 4a and the third region 4c.

A composition of the compound of the first region 4a is an average composition of the entire first region 4a unless otherwise specified. When a thickness of the first n-type layer 4A is d, the composition of the first region 4a is an average value of the compositions at depths of 0.10d, 0.20d, and 0.30d from a surface of the first n-type layer 4A on the p-type light-absorbing layer 3 side. When the first n-type layer 4A is very thin (for example, 10 nm or less), the composition at a depth of 0.2d from the surface of the first n-type layer 4A on the p-type light-absorbing layer 3 side is regarded as the composition of the entire first n-type region 4a. When a thickness of the first n-type layer 4A is d, the composition of the second region 4b is an average value of the compositions at depths of 0.40d, 0.50d, and 0.60d from a surface of the first n-type layer 4A on the p-type light-absorbing layer 3 side. When the first n-type layer 4A is very thin (for example, 10 nm or less), the composition at a depth of 0.5d from the surface of the first n-type layer 4A on the p-type light-absorbing layer 3 side is regarded as the composition of the entire second region 4b. When a thickness of the first n-type layer 4A is d, the composition of the third region 4c is an average value of the compositions at depths of 0.70d, 0.80d, and 0.90d from a surface of the first n-type layer 4A on the p-type light-absorbing layer 3 side. When the first n-type layer 4A is very thin (for example, 10 nm or less), the composition at a depth of 0.80d from the surface of the first n-type layer 4A on the p-type light-absorbing layer 3 side is regarded as the composition of the entire third region 4c.

The composition of the first region 4a, the second region 4b, and the third region 4c correspond to the composition of the first n-type layer 4A, the second n-type layer 4B, and the third n-type layer 4C of the third embodiment, respectively.

Sixth Embodiment

Figure 7:
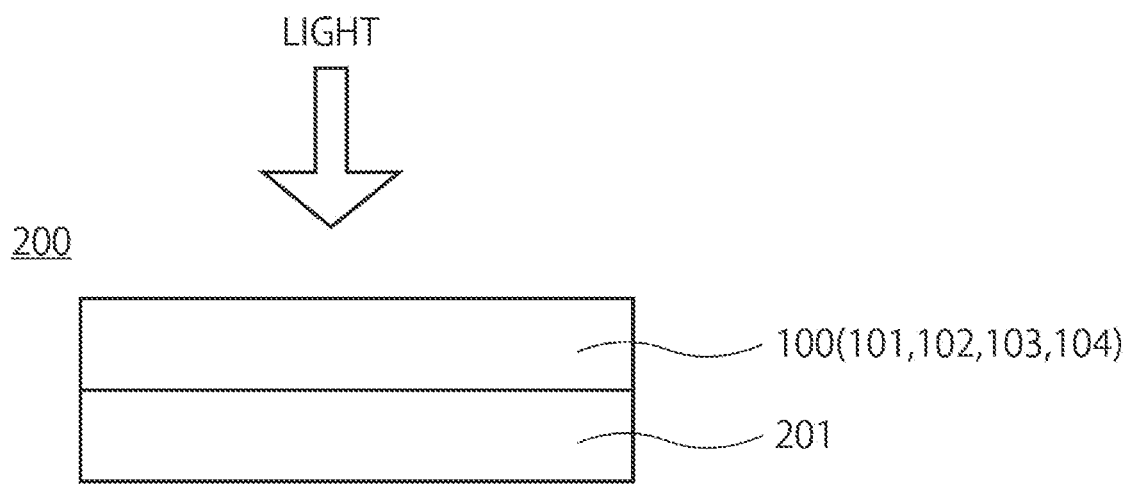
FIG. 7 is a cross-sectional view of a multi-junction solar cell according to an embodiment.

A sixth embodiment relates to a multi-junction solar cell. FIG. 7 illustrates a conceptual sectional diagram of a multi-junction solar cell 200 according to the sixth embodiment. The multi-junction solar cell 200 of FIG. 7 includes the solar cell (first solar cell) 100 of the first embodiment on the light incident side and a second solar cell 201. The band gap of the photoelectric conversion layer of the second solar cell 201 is smaller than the band gap of the light-absorbing layer 3 of the solar cell 100 according to the first embodiment. Incidentally, the multi-junction solar cell according to the embodiment includes a solar cell in which three or more solar cells are joined. Incidentally, in the sixth embodiment, the solar cell 101-104 of the second embodiment to the fifth embodiment can be used instead of the solar cell 100 of the first embodiment.

The band gap of the p-type light-absorbing layer 3 of the first solar cell 100 according to the first embodiment is about 2.0 eV-2.2 eV, and thus the band gap of the light-absorbing layer of the second solar cell 200 is preferably 1.0 eV or more and 1.6 eV or less. The light-absorbing layer of the second solar cell is preferably selected from the group consisting of any one or more compound semiconductor layers among CIGS-based having a high In content CuZnSnSSe-based and CdTe-based compound semiconductor layers, crystalline silicon and perovskite type compound.

Seventh Embodiment

Figure 8:
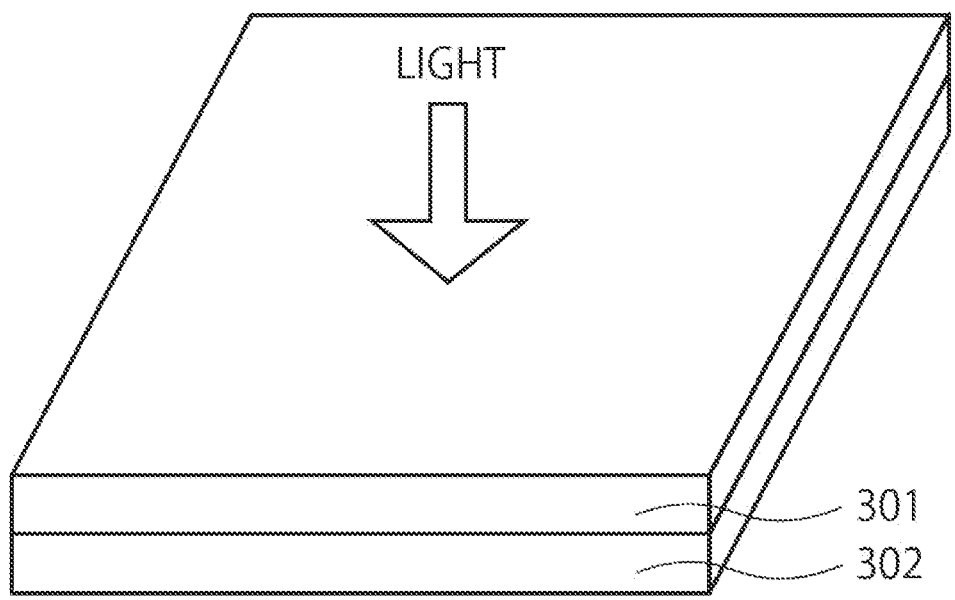
FIG. 8 is a perspective view of a solar cell module according to an embodiment.

A seventh embodiment relates to a solar cell module. FIG. 8 illustrates a perspective diagram of a solar cell module 300 according to the sixth embodiment. The solar cell module 300 in FIG. 8 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 9:
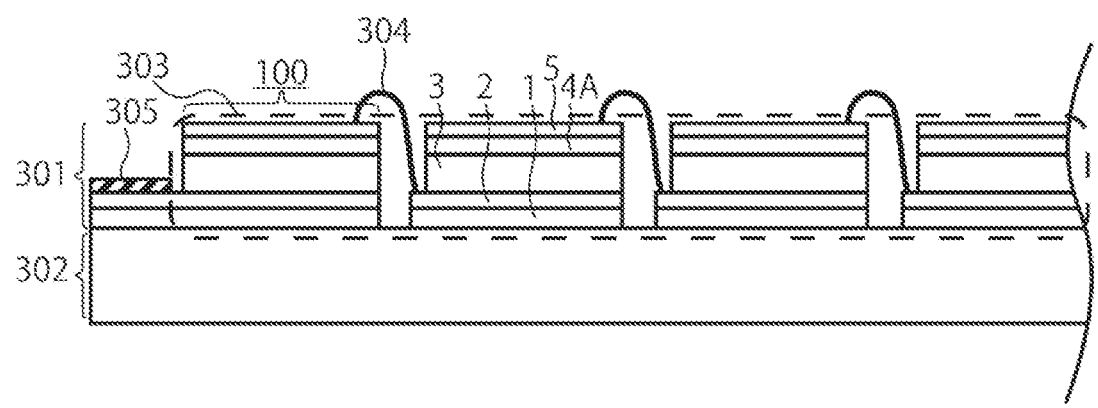
FIG. 9 is a cross-sectional view of a solar cell module according to an embodiment.

FIG. 9 illustrates a sectional diagram of the solar cell module 300. In FIG. 9, the structure of the first solar cell module 301 is illustrated in detail but the structure of the second solar cell module 302 is not illustrated. In the second solar cell module 301, the structure of the solar cell module is appropriately selected depending on the light-absorbing layer of the solar cell to be used. In the solar cell module 300 in FIG. 9, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Similar to the solar cell 100 of the first embodiment, the solar cell 100 of the third embodiment includes the substrate 1, p-electrode 2, the p-type light-absorbing layer 3, the n-type layer 4, and the n-electrode 5. Both ends of the solar cell 100 in the submodule 303 are connected to the busbar 305. The busbar 305 is preferably configured to electrically connect a plurality of submodules 303 in parallel or in series and adjust the output voltage with the second solar cell module 302. Incidentally, the connection system of the solar cell 100 shown in the fourth embodiment is an example. The solar cell module can be configured by other connection systems.

Eighth Embodiment

Figure 10:
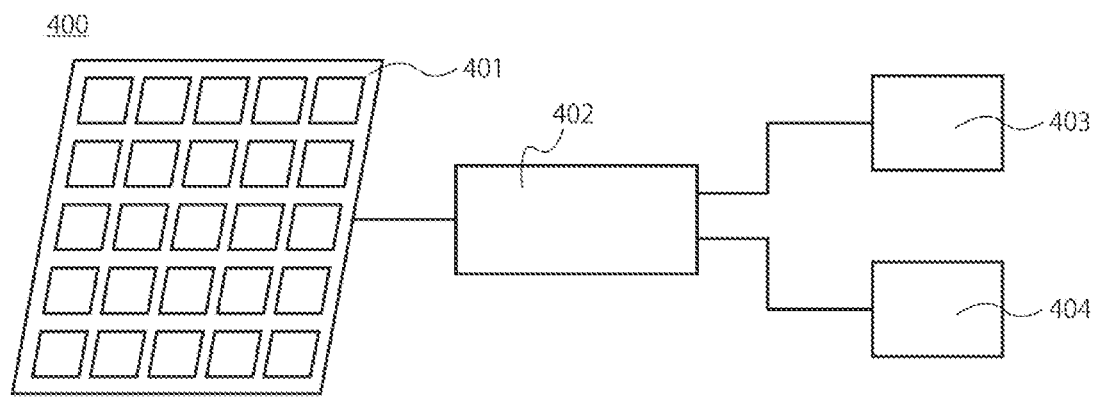
FIG. 10 is a structural view of a photovoltaic power generation system according to an embodiment.

An eighth embodiment relates to a solar photovoltaic power generation system. The solar cell module according to the seventh embodiment can be used as a generator which generates electric power in the solar photovoltaic power generation system according to the eighth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 10 illustrates a configuration diagram of a solar photovoltaic power generation system 400 according to the embodiment. The solar photovoltaic power generation system in FIG. 10 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module.

Figure 11:
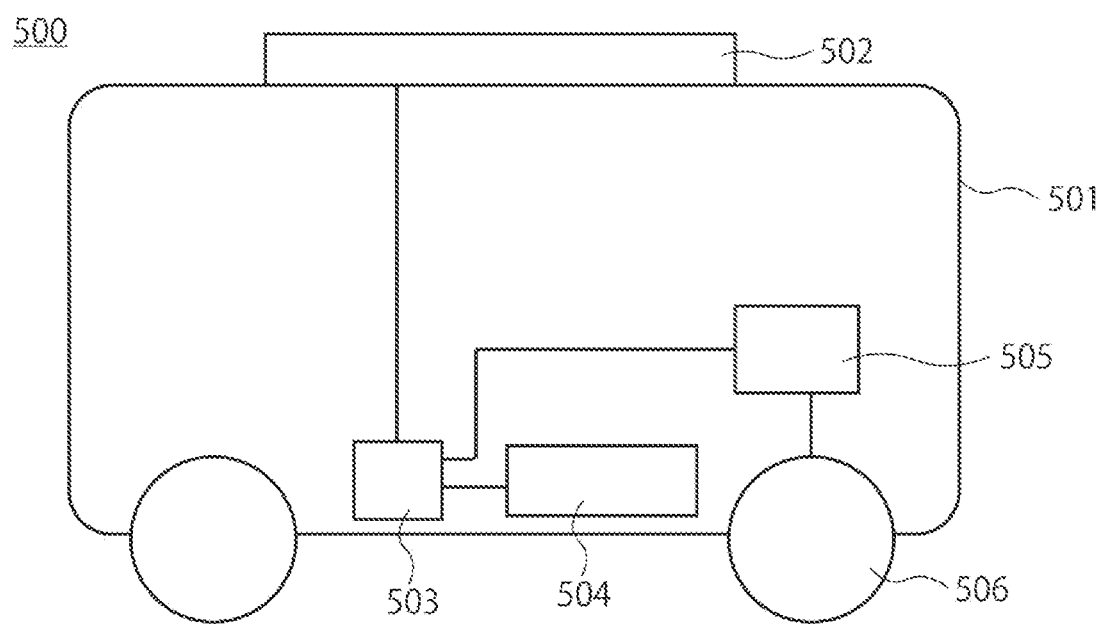
FIG. 11 is a conceptual diagram of a vehicle according to an embodiment.

A vehicle is described as an example of utilization of the solar photovoltaic power generation system 400. FIG. 11 illustrates a conceptual configuration diagram of a vehicle 500. The vehicle 500 in FIG. 11 includes a vehicle body 501, a solar cell module 502, a power converter 503, a storage battery 504, a motor 505, and tires (wheels) 506. The electric power generated by the solar cell module 501 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 501 or the storage battery 504. The solar cell module 501 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501. Hereinafter, the present disclosure will be described more specifically based on Examples, but the present disclosure is not limited to the following Examples.

Example 1

ITO (In:Sn=90:10, film thickness 20 nm) and ATO (Sn Sb=98:2, film thickness: 150 μm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen and argon gas atmosphere. Thereafter, by an ALD method, 10 nm of $Ga_{1.20}Al_{0.80}O_{3.4}$ having no composition inclination is deposited as a first n-type layer, and 10 nm of $Zn_{0.80}Sn_{0.20}O_{1.20}$ having no composition inclination as a first n-type layer and an AZO transparent conductive film as the n-electrode are deposited on the deposited surface side. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance. An oxygen composition ratio of the n-type layer is obtained from a type and a composition ratio of metal of a metal oxide.

The transmittance of the solar cell is evaluated. The transparency of the solar cell is an average transmittance when a wavelength of 700-1200 nm is measured with a spectrophotometer.

Examples 2 to 38 and Comparative Examples

Tables related to examples are shown in FIG. 12 and FIG. 13. Conditions of n-type layers of Examples and Comparative Examples are shown in the table of FIG. 12. The same procedures as in Example 1 were carried out except for the conditions of the n-type layers. When two-layer or three layer of the n-type layer is formed in Examples, a thickness of each n-type layer is 6 nm. In example 32, a composition of Ti is changed inclinedly so that Ti is large on the p-type light-absorbing layer side and small on the n-electrode side. In example 33, a composition of Al is changed inclinedly so that Al is large on the p-type light-absorbing layer side and small on the n-electrode side. In example 34, a composition of Hf is changed inclinedly so that Hf is large on the p-type light-absorbing layer side and small on the n-electrode side. In examples 35-38, the n-type layer is formed to include a plurality of the n-type region shown in table of FIG. 12 so that the n-type layer is single layer, the target ratio is inclinedly changed as shown in the table, and there is no interface in the n-type layer.

The amount of light is adjusted to 1 sun by using a solar simulator simulating a light source of AM 1.5 G and using a reference Si cell under a light source. A temperature in a measurement chamber is 25° C. under an atmospheric pressure. A voltage is swept, and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In the table of FIG. 13, the short circuit current (Jsc), the open circuit voltage (Voc), the fill factor (FF), the conversion efficiency, and the light transmittance of Examples and Comparative Examples are collectively illustrated.

The transmittance is evaluated as A when the transmittance of light in a wavelength band of 700 nm or more and 1200 nm or less is 75% or more, is evaluated as B when the transmittance of light in a wavelength band of 700 nm or more and 1200 nm or less is 70% or more and less than 75%, and is evaluated as C when the transmittance of light in a wavelength band of 700 nm or more and 1200 nm or less is less than 70%.

Jsc is evaluated as A when the conversion efficiency is 1.02 times or more the conversion efficiency of Comparative Example 1, is evaluated as B when the conversion efficiency is 0.95 times or more and less than 1.02 times Jsc of Comparative Example 1, and is evaluated as C when the conversion efficiency is less than 0.95 times Jsc of Comparative Example 1.

Voc is evaluated as A when Voc is 1.30 times or more the conversion efficiency of Comparative Example 1, is evaluated as B when Voc is 1.00 times or more and less than 1.30 times Voc of Comparative Example 1, and is evaluated as C when Voc is less than 1.00 times Voc of Comparative Example 1.

FF is evaluated as A when FF is 1.01 times or more the conversion efficiency of Comparative Example 1, is evaluated as B when FF is 0.70 times or more and less than 1.01 times FF of Comparative Example 1, and is evaluated as C when FF is less than 0.7 times FF of Comparative Example 1.

The conversion efficiency is evaluated as A when the conversion efficiency is 1.3 times or more the conversion efficiency of Comparative Example 1, is evaluated as B when the conversion efficiency is 1.01 times or more and less than 1.3 times the conversion efficiency of Comparative Example 1, and is evaluated as C when the conversion efficiency is less than 1.01 times the conversion efficiency of Comparative Example 1.

As can be seen from the table of FIG. 13, the short-circuit current density Jsc tends to increase when Ti and Sn is a lot or when it is multi-layered. It is considered that the amount of light absorbed inside $Cu_2O$ is increased because the refractive index distribution from $Cu_2O$ to the n-electrode is improve because the refractive index of $TiO_2$ $SnO_2$ is larger than that of $Ga_2O_3$. In Comparative Examples 2 to 4, it is considered that the short-circuit current density was increased as a result of the increase in the refractive index by introducing In and Zn. The increasing is confirmed in the result of suppressing recombination at the interface by multi-layering. Furthermore, it can be also confirmed that the recombination of electron inside the n-type layer is suppressed by forming the composition change inside the n-type layer. The effect of multi-layering also appears in the fill factor, and it can be seen that the effect is increased as the number of layers is increased. The open circuit voltage tends to increase when the amount of Hf and Zr in the first n-type layer (first region) is large, and lowering the difference in conduction band position between $Cu_2O$ and the first n-type layer (first region) may contribute. However, if Hf and Zr are too much, the conduction band position becomes too high than the conduction band position of $Cu_2O$, which may result in a decrease in conversion efficiency. In a multi-junction solar cell using the solar cell of the example as a top cell and using a solar cell having Si as a light-absorbing layer as a bottom cell, the multi-junction solar cell having an excellent conversion efficiency can be obtained because of the high transparency and conversion efficiency of the top cell.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
a p-electrode;
an n-electrode;
a p-type light-absorbing layer located between the p-electrode and the n-electrode and mainly containing a cuprous oxide; and
a first n-type layer which is located between the p-type light-absorbing layer and the n-electrode, which mainly contains a compound represented by $Ga_{x1}M1_{x2}M2_{x3}M3_{x4}M4_{x5}O_{x6}$, the M1 being Hf or/and Zr, the M2 being one or more selected from the group consisting of In, Ti, and Zn, the M3 being Al or/and B, the M4 is one or more selected from the group consisting of Sn, Si, and Ge, the x1, the x2, and when a sum of the x1, the x2, the x3, the x4, and the x5 is 2, the x6 being 3.0 or more and 3.8 or less.

2. The solar cell according to claim 1,
wherein $(x1+x2)/(x1+x2+x3+x4+x5)$ is 0.60 or more and 1.00 or less,
$x2/(x1+x2)$ is 0.10 or more and 0.60 or less,
$x3/(x1+x2+x3+x4+x5)$ is 0.00 or more and 0.40 or less.

3. The solar cell according to claim 1,
wherein $(x1+x2)/(x1+x2+x3+x4+x5)$ is 0.80 or more and 1.00 or less
$x2/(x1+x2)$ is 0.30 or more and 0.55 or less,
$x3/(x1+x2+x3+x4+x5)$ is 0.00 or more and 0.10 or less,
$x4/(x1+x2+x3+x4+x5)$ is 0.00 or more and 0.10 or less, and
$x5/(x1+x2+x3+x4+x5)$ is 0.00 or more and 0.10 or less.

4. The solar cell according to claim 1,
wherein one or more selected from the group consisting of the Ga, an element of M1, an element of M2, an element of M3, and an element of M4 have a composition ratio changing in the first n-type layer in a film thickness direction of the first n-type layer.

5. The solar cell according to claim 1,
further comprising a second n-type layer which is located between the first n-type layer and the n-electrode, and which mainly contains a compound represented by $Ga_{y1}M1_{y2}M2_{y3}M3_{y4}M4_{y5}O_{y6}$,
wherein the y1 and the y6 are more than 0,
the y2, the y3, the y4, and the y5 are 0 or more, and
the y6 when a sum of the y1, the y2, the y3, the y4, and the y5 is 2 is 3.0 or more and 3.8 or less.

6. The solar cell according to claim 5,
wherein $y2/(y1+y2)$ is 0.00 or more and 0.30 or less,
$(y1+y2)/(y1+y2+y3+y4+y5)$ is 0.80 or more and 1.00 or less,
$y3/(y1+y2+y3+y4+y5)$ is 0.00 or more and 0.40 or less,
$y4/(y1+y2+y3+y4+y5)$ is 0.00 or more and 0.10 or less, and
$y5/(y1+y2+y3+y4+y5)$ is 0.00 or more and 0.10 or less.

7. The solar cell according to claim 5,
wherein $y2/(y1+y2)$ is 0.00 or more and 0.20 or less,
$(y1+y2)/(y1+y2+y3+y4+y5)$ is 0.90 or more and 1.00 or less,
$y3/(y1+y2+y3+y4+y5)$ is 0.00 or more and 0.10 or less, and
$y4/(y1+y2+y3+y4+y5)$ is 0.00 or more and 0.05 or less.

8. The solar cell according to claim 5,
wherein the y2 is 70% or less of the x2.

9. The solar cell according to claim 5,
wherein one or more selected from the group consisting of the Ga in the $Ga_{y1}M1_{y2}M2_{y3}M3_{y4}M4_{y5}O_{y6}$, an element of M1 in the $Ga_{y1}M1_{y2}M2_{y3}M3_{y4}M4_{y5}O_{y6}$, an element of M2 in the $Ga_{y1}M1_{y2}M2_{y3}M3_{y4}M4_{y5}O_{y6}$, an element of M3 in the $Ga_{y1}M1_{y2}M2_{y3}M3_{y4}M4_{y5}O_{y6}$, and an element of M4 in the $Ga_{y1}M1_{y2}M2_{y3}M3_{y4}M4_{y5}O_{y6}$ have a composition ratio changing in the second n-type layer in a film thickness direction of the second n-type layer.

10. The solar cell according to claim 5,
further comprising a third n-type layer which is located between the first n-type layer and the n-electrode, and which mainly contains a compound represented by $Ga_{z1}Zn_{z2}Sn_{z3}M5_{z4}O_{z5}$,
the M5 is one or more selected from the group consisting of Hf, Zr, In, Ti, Al, B, Si, Mg, and Ge,
the z1, z2, z3, z4, and the z5 are 0 or more, and
the z5 when a sum of the z1, the z2, the z3, and the z4 is 2 is 2.2 or more and 3.6 or less.

11. The solar cell according to claim 10,
wherein $(z1+z2)/(z1+z2+z3+z4)$ is 0.60 or more and 0.98 or less,
$z3/(z1+z2+z3+z4)$ is 0.10 or more and 0.50 or less, and
$z4/(z1+z2+z3+z4)$ is 0.00 or more and 0.50 or less.

12. The solar cell according to claim 10,
wherein one or more selected from the group consisting of the Ga and one or more elements including in the third n-type layer as the M5 have a composition ratio changing in the third n-type layer in a film thickness direction of the third n-type layer.

13. A multi-junction solar cell comprising:
the solar cell according to claim 1; and
a solar cell including a light-absorbing layer in which a band gap is smaller than a band gap of the p-type light-absorbing layer of the solar cell according to claim 1.

14. A solar cell module using the solar cell according to claim 1.

15. A photovoltaic power generation system that performs photovoltaic power generation by using the solar cell module according to claim 14.

* * * * *